(12) United States Patent
Chen et al.

(10) Patent No.: US 12,148,676 B2
(45) Date of Patent: Nov. 19, 2024

(54) EMBEDDED CHIP PACKAGE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Jindong Feng, Guangdong (CN); Benxia Huang, Guangdong (CN); Lei Feng, Guangdong (CN); Wenshi Wang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 0 days.

(21) Appl. No.: 18/389,264

(22) Filed: Nov. 14, 2023

(65) Prior Publication Data

US 2024/0087972 A1    Mar. 14, 2024

Related U.S. Application Data

(62) Division of application No. 17/044,087, filed as application No. PCT/CN2020/089735 on May 12, 2020, now Pat. No. 11,854,920.

(30) Foreign Application Priority Data

Apr. 2, 2020    (CN) .......................... 202010255623.9

(51) Int. Cl.
*H01L 21/56*    (2006.01)
*H01L 23/00*    (2006.01)
*H01L 23/04*    (2006.01)
*H01L 23/29*    (2006.01)
*H01L 23/31*    (2006.01)
*H01L 23/36*    (2006.01)
*H01L 23/48*    (2006.01)
*H01L 23/485*   (2006.01)

(52) U.S. Cl.
CPC ........ *H01L 23/3107* (2013.01); *H01L 21/561* (2013.01); *H01L 21/568* (2013.01); *H01L 23/041* (2013.01); *H01L 23/293* (2013.01); *H01L 23/36* (2013.01); *H01L 23/481* (2013.01); *H01L 23/485* (2013.01); *H01L 24/96* (2013.01)

(58) Field of Classification Search
None
See application file for complete search history.

(56) References Cited

U.S. PATENT DOCUMENTS

2019/0237382 A1*  8/2019  Kim ................. H01L 24/92
2020/0328160 A1* 10/2020  Kim ................. H01L 24/12

* cited by examiner

*Primary Examiner* — Jay C Chang
(74) *Attorney, Agent, or Firm* — The PL Law Group, PLLC

(57) ABSTRACT

Disclosed is an embedded chip package, comprising at least one chip and a frame surrounding the at least one chip, the chip having a terminal face and a back face separated by a height of the chip, the frame having a height equal to or larger than the height of the chip, wherein the gap between the chip and the frame is fully filled with a photosensitive polymer dielectric, the terminal face of the chip being coplanar with the frame, a first wiring layer being formed on the terminal face of the chip and a second wiring layer being formed on the back face of the chip. Moreover, a method for manufacturing an embedded chip package is disclosed.

9 Claims, 6 Drawing Sheets

EMBEDDED CHIP PACKAGE AND MANUFACTURING METHOD THEREOF

PRIORITY

The present application is a divisional application of U.S. patent application Ser. No. 17/044,087, filed on Sep. 30, 2020, which is a National Stage entry from International Application No. PCT/CN2020/089735, filed May 12, 2020, which claims priority to the benefit of Chinese Patent Application No. 202010255623.9 filed on Apr. 2, 2020, in the Chinese Intellectual Property Office, the entire contents of which are incorporated herein by reference.

BACKGROUND

1. Field of the Invention

The present invention relates to chip package, and specifically to an embedded chip package and a manufacturing method thereof.

2. Description of the Related Art

With the vigorous development of the electronics industry, it is time for the electronic products to have multiple functions, miniaturized appearance and high performance. The increasing requirements on high density, multifunction and miniaturization bring new challenges to packages and substrates. Many new packaging technologies are developed accordingly, comprising the embedded package technology.

With the embedded package technology, passive devices (such as resistor, capacitor, inductor) or even active devices (such as IC) are embedded into the inside of the packaged substrate. This method can shorten the line length between elements and improve electrical characteristics, and also can improve effective PCB packaging area and reduce many solder bumps on the PCB surface, thus improving packaging reliability and lowering cost, and thus is a perfect high-density packaging technology.

However, either for the wafer scale embedding technology or for the panel scale embedding technology, the packaging material is the thermosetting polymer (such as prepreg (PP) or epoxy resin type polymer such as Ajinomoto buildup film (ABF)) or the thermoplastic polymer (such as polyethylene (PE)). In order to achieve heat dissipation on both sides of the chip, it is necessary to expose an opening on the packaging material to form a via-post, a terminal or a heat dissipation pad. Commonly used methods comprise laser drilling and mask dry etching on the packaging material. However, these methods have obvious technical defects.

In the US patent publication US20190124772A1, it is disclosed that the thermosetting dielectric (cured under certain temperature and pressure conditions) is used as the packaging material. Then, a method of laser drilling is used to expose the conduction post(s) (terminal) of the chip or device. Finally, a method of electroplating and hole-filling is used to fill the laser hole(s) with Cu, thus achieving electrical connection. However, this method is not suitable for embedding of a die and a device without a conduction post having a high aspect ratio because the conductive metal pad on the outer layer of the die has a thickness of only 2~5 μm and the conduction terminal of the device without a conduction post has a thickness of only 6~15 μm, and the energy produced by laser radiation is too high to the metal pad or terminal having such thickness, enough to damage the whole chip structure or break down the conduction terminal of the device.

A Chinese application publication CN106997870A discloses an embedded structure with both sides conducted. Also, the thermosetting dielectric is used as the packaging material to fix the chip, and then a method of plasma dry etching is used to open the chip back face to achieve connection of both sides. When using this method to form a large opening (such as an opening of millimeter or centimeter scale), especially in the case of large thickness of packaging material, the etching time is long and the efficiency is low. For example, in the application, the thickness of the packaging material is 15 μm~50 μm, and in the case of forming a large opening for heat dissipation, it is necessary for the dry etching to take the etching time of 50 min~150 min, low in operation efficiency. In the case of forming a small via (such as a via with its diameter lower than 200 μm), as the gas of the dry etching has a lower exchange rate in the small via, the etching rate is further decreased and the via bottom has a poor quality (diameter, roundness, etc.), difficult to achieve excellent heat/electric conduction performance.

Therefore, there are disadvantages in the prior art as below:

In the case of using laser drilling to form an opening on the common packaging material, the laser energy is prone to produce a stress in the chip or device and may cause damage of the chip or device. Therefore, it is not suitable for embedding of a die/a device without a conduction post.

In the case of using dry etching to form an opening on the common packaging material, it is difficult to achieve a small opening. Besides, even for a large opening, there are disadvantages of long work flow, low manufacturing output, limitation on product design, poor uniformity, short life, etc. In addition, for the dry etching, it is generally necessary to grind the packaging material to make it thinner. However, the panel frame is generally made of glass fiber composite material (such as BT), and thus there is a problem of exposure of glass fiber after grinding, which would lead to weakened capability of fine circuits. For example, Cu on the glass fiber has a poor bonding force and is prone to be peeled; and the exposed glass fiber is prone to form an electromigration channel, leading to failure in electrical properties and reduction in life.

SUMMARY

One of the objectives of the present invention is to provide an embedded chip package using a photosensitive polymer dielectric material as the packaging material as well as the manufacturing method thereof, so as to overcome the technical defect(s) in the prior art.

The first aspect relates to an embedded chip package comprising at least one chip and a frame surrounding the at least one chip, the chip having a terminal face and a back face separated by a height of the chip, the frame having a height equal to or larger than the height of the chip, wherein the gap between the chip and the frame is fully filled with a photosensitive polymer dielectric, the terminal face of the chip being coplanar with the frame, a first wiring layer being formed on the terminal face of the chip and a second wiring layer being formed on the back face of the chip.

Preferably, the photosensitive polymer dielectric material is selected from a group comprising polyimide photosensitive resin and polyphenylene oxide photosensitive resin.

In some embodiments, the frame further comprises at least one frame via-post which extends through the height of the frame from a first frame face to a second frame face of the frame.

In some embodiments, the terminal face of the chip comprises a metal terminal pad which is conductively connected to the first wiring layer through a first via-post surrounded in the photosensitive polymer dielectric.

In some embodiments, the back face of the chip is formed thereon with a second via-post surrounded by the photosensitive polymer dielectric.

Preferably, the second via-post is conductively connected the back face of the chip and the second wiring layer. Preferably, the second wiring layer comprises a heat dissipation pad.

In some embodiments, the back face of the chip is provided with a Si via connected to the terminal on the terminal face of the chip, or is provided with the chips stacked back to back such that the back face of the chip is provided with a terminal.

In some embodiments, a third via-post and a fourth via-post are formed on the both ends of the frame via-post respectively from both sides of the frame, wherein the third via-post is conductively connected to the first wiring layer and the fourth via-post is conductively connected to the second wiring layer.

Generally, the chip is selected from at least one of integrated circuit, passive device and active device. Preferably, the chip comprises power device or chips stacked and combined back to back.

Preferably, the frame via-post, the frame via-post, the first via-post, the second via-post, the third via-post and the fourth via-post comprises Cu.

The second aspect relates to a method for manufacturing an embedded chip package, comprising the following steps:
  obtaining a chip socket array comprising a frame, wherein the frame is formed therein with a frame via-post passing through a height of the frame;
  placing the chip socket array onto an adhesive tape;
  placing a chip, with its terminal face facing downwards, into a cavity of the chip socket array surrounded by the frame;
  laminating or coating a first photosensitive polymer dielectric onto the chip and the frame such that the photosensitive polymer dielectric fully fills a gap between the chip and the frame and covers the back face of the chip and an upper surface of the frame;
  exposing and developing the first photosensitive polymer dielectric to form a first pattern which forms a first blind via exposing an end of the frame via-post at the upper surface of the frame and a second blind via revealing the back face of the chip;
  removing the adhesive tape, and laminating or coating a second photosensitive polymer dielectric onto the terminal face of the chip and a lower surface of the frame;
  exposing and developing the second photosensitive polymer dielectric to form a second pattern which forms a third blind via exposing a terminal of the chip and a fourth blind via exposing an end of the frame via-post at the lower surface of the frame;
  applying a metal seed layer onto the first pattern and the second pattern;
  applying a photoresist layer onto the metal seed layer, and patterning the photoresist layer to form a third pattern comprising a first wiring layer and a second wiring layer; and
  performing Cu electroplating to simultaneously fill the first, second and third patterns to form first, second, third and fourth via-posts and the first and second wiring layers.

In some embodiments, the photosensitive polymer dielectric material is selected from a group comprising polyimide photosensitive resin and polyphenylene oxide photosensitive resin.

In some embodiments, the metal seed layer comprises Ti, W, or Ti/W alloys.

In some embodiments, the first wiring layer is conductively connected through the first via-post to the terminal pad of the chip, the second wiring layer is conductively connected through the second via-post to the back face of the chip.

Preferably, the frame via-post, the frame via-post, the first via-post, the second via-post, the third via-post and the fourth via-post comprises Cu.

In some embodiments, the method further comprises: after the Cu electroplating, removing the photoresist layer and etching off the exposed metal seed layer.

In some embodiments, the method further comprises: performing layer building-up and re-wiring on the first and/or second wiring layers to stack and construct an additional wiring layer.

In some embodiments, the method further comprises: applying a solder mask onto the first wiring layer and/or the second wiring layer.

Generally, the method further comprises: cutting the chip socket array into individual package chips.

The photosensitive polymer dielectric as mentioned herein means a type of photosensitive resin material having relatively low dielectric constant and dielectric loss. The photosensitive polymer dielectric commonly used now is a negative one which can excite a photoinitiator to cross-link and polymerize small-molecule unsaturated organic oligomers to form a stable solid organic polymer product, under the effect of light (such as UV light or visible light) or high energy rays (such as electron beam).

Generally, the photosensitive resin is used as a photoresist material such as that for photolithography. In the packaging applications as mentioned herein, however, it is necessary for this type of photosensitive polymer dielectric to have some special properties, such as relatively high dielectric properties within a relatively broad temperature range and frequency range (for example, a dielectric constant of 2.5~3.4, a dielectric loss of 0.001~0.01, a dielectric strength of 100 KV~400 KV), and to have a relatively excellent adhesion, a relatively low stress, etc.

Herein, the photosensitive polymer dielectric is used as the chip packaging material, thus enabling to simplify the steps of the manufacturing process, improve the production efficiency and lower the cost. For example, it is possible to simultaneously form a plurality of patterns and then simultaneously perform electroplating and filling. Moreover, it is possible to avoid a risk of damage to embedded chips due to traditional hole-opening methods, thus improving the yield rate. Furthermore, as it is not necessary in the present method to grind the panel or frame, there is no risk of exposing glass fibers, for example.

BRIEF DESCRIPTION OF THE DRAWINGS

In order to better understand the present invention and illustrate the embodiments of the present invention, the accompanying drawings are referred to only in an exemplary way.

Now specifically referring to the figures/drawings, it should be emphasized that the specific graphical representation is provided only in an exemplary way, and only for the purpose of discussion of the preferred embodiments of the present invention. The graphical representation is provided for the reason that the figures are believed to be useful to make the principle(s) and concept(s) of the present invention understood easily. In this regard, it is intended to illustrate the structural details of the present invention only in a detail degree necessary to generally understand the present invention. In the figures.

DETAILED DESCRIPTION

The present invention relates to an embedded chip package, characterized in that a chip and a frame are embedded in a photosensitive polymer dielectric serving as a packaging material, an opening is formed directly on the back face of the chip with a metal post (such as Cu post) being deposited therein, while an opening is also formed on the terminal face of the chip by applying the photosensitive polymer dielectric to form a metal post for conducting a terminal of the chip, thereby forming a structure in which both sides of the chip can be used for conduction or heat dissipation.

The photosensitive polymer dielectric used in the present invention is mainly selected from polyimide photosensitive resin and polyphenylene oxide photosensitive resin, such as Microsystems HD-4100, Hitachi PVF-02, etc.

The metal post formed on the chip terminal face is used for connecting the chip terminal with the first wiring layer. The metal post formed on the chip back face is generally used as a heat dissipation pad or is connected to a heat dissipation device such that the heat can be dissipated more effectively. If the chip back face is also provided with a terminal (for example, the chip has a structure with a Si via passing through the chip, or there are a plurality of chips stacked in a back-to-back 3D manner), a Cu post formed on the chip back face also can provide a function of electric connection.

In addition, on the back face and the terminal face of the chip, it is also possible to further perform layer building-up to stack and construct an additional wiring layer to form a multi-layer interconnected structure, thus forming a so-called package-on-package (PoP) structure.

Figure 1:
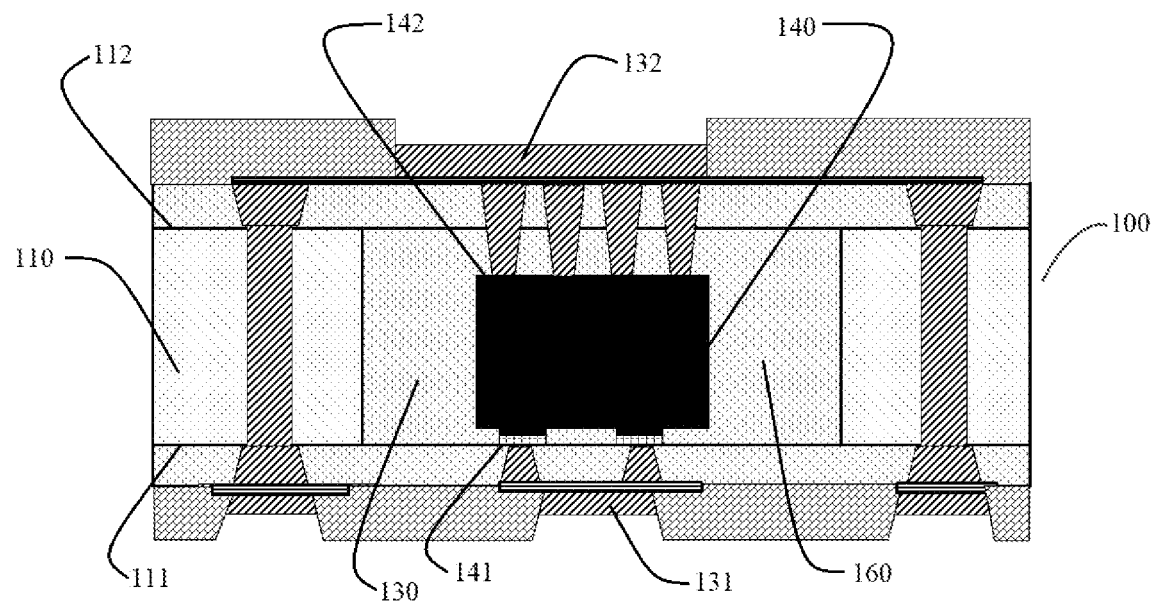
FIG. 1 is a schematic side view of a first embedded chip structure.

Referring to FIG. 1, it shows an embedded chip package 100 with both faces being connected. The embedded chip package 100 comprises a chip 140 having a terminal face 141 and a back face 142 separated by a height of the chip. The chip 140 is disposed in a cavity 130 surrounded by a frame 110 which has a first frame face 111 coplanar with the chip terminal face 141 and an opposite second frame face 112. The frame 110 has a thickness larger than the height of the chip 140, generally by 15~50 μm, such that the second frame face 112 is higher than the back face 142 of the chip 140. A gap between the chip 140 and the frame 110 is filled with a photosensitive polymer dielectric packaging material 160 comprising a polyimide photosensitive resin or a polyphenylene oxide photosensitive resin.

In contrast with prior embedded chip packages, in the chip package 100, the packaging material 160 not only covers the chip back face 142 and the second frame face 112, but also can cover the chip terminal face 141 and the first frame face 111. Thus, by photolithography and plate-filling, it is possible to form a layer of via-post respectively on both surfaces of the chip package 100 so as to accordingly conduct a first wiring layer 131 with a second wiring layer 132.

One or more conductive via-posts 120 (such as Cu via-posts) may be conFIGured to pass through the thickness of the frame 110. These via-posts 120 connect the first frame face 111 and the second frame face 112.

The chip 140 may be a device having a Si via passing through the chip or may comprise a plurality of chips stacked back to back such that the back face 142 of the chip 140 is provided with a terminal which is electrically connectable.

The frame 110 has a first polymer matrix, and may comprise glass fiber and ceramic fillers. In some embodiments, the frame 110 is made from a prepreg of woven glass fibers impregnated with polymer.

Figure 2:
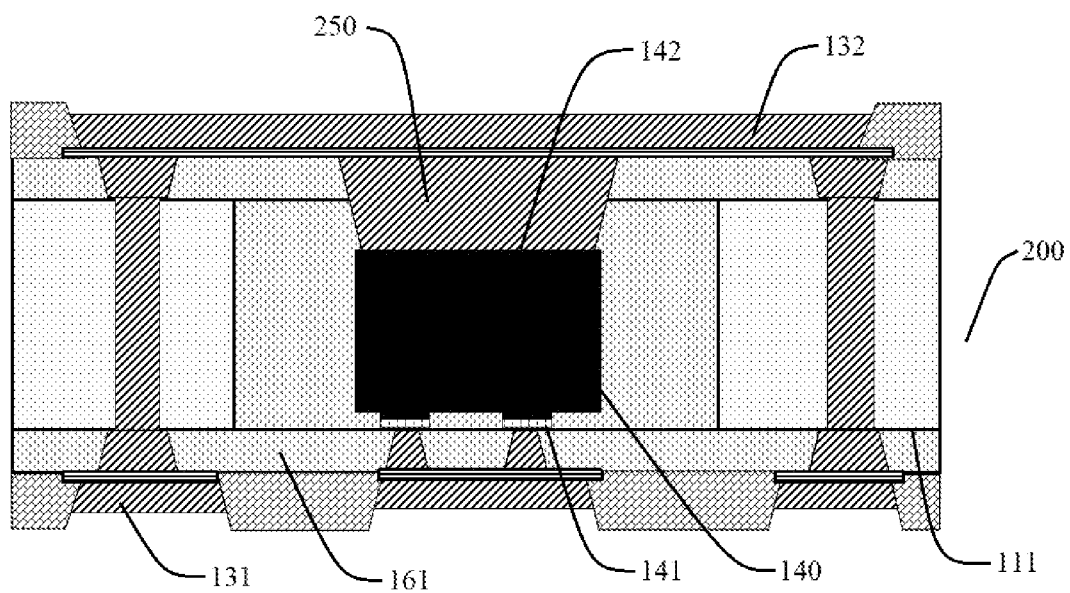
FIG. 2 is a schematic side view of a second embedded chip structure.

Referring to FIG. 2, it shows an embedded chip package 200 with a heat dissipation pad formed on the chip back face. The embedded chip package 200 is similar in structure to the chip package 100 of FIG. 1, with a difference only in that a heat dissipation pad 250 is formed by filling a heat dissipation metal in a large opening formed on the chip back face 142. This type of chip package 200 is applicable to large power devices, especially chips required to enable electric conduction on a single face and heat dissipation on both faces.

The chip packages 100 and 200 of FIGS. 1 and 2 are not limited to the case required to enable electric conduction on both faces or the case required to enable electric conduction on a single face and heat dissipation on both faces, and they are also applicable to the case required to enable electric conduction on a single face (the terminal face) of the chip, without any opening on the back face. In the chip packages 100 and 200 of FIGS. 1 and 2, according the design requirement(s), the chip terminal face 141 may be covered with a photosensitive polymer dielectric 161 to lead out a metal terminal, or a wiring layer can be formed directly on the chip terminal face 141 flushing with the surface 111 of the frame 110, 210, without a layer of the photosensitive polymer dielectric 161.

Figure 3:
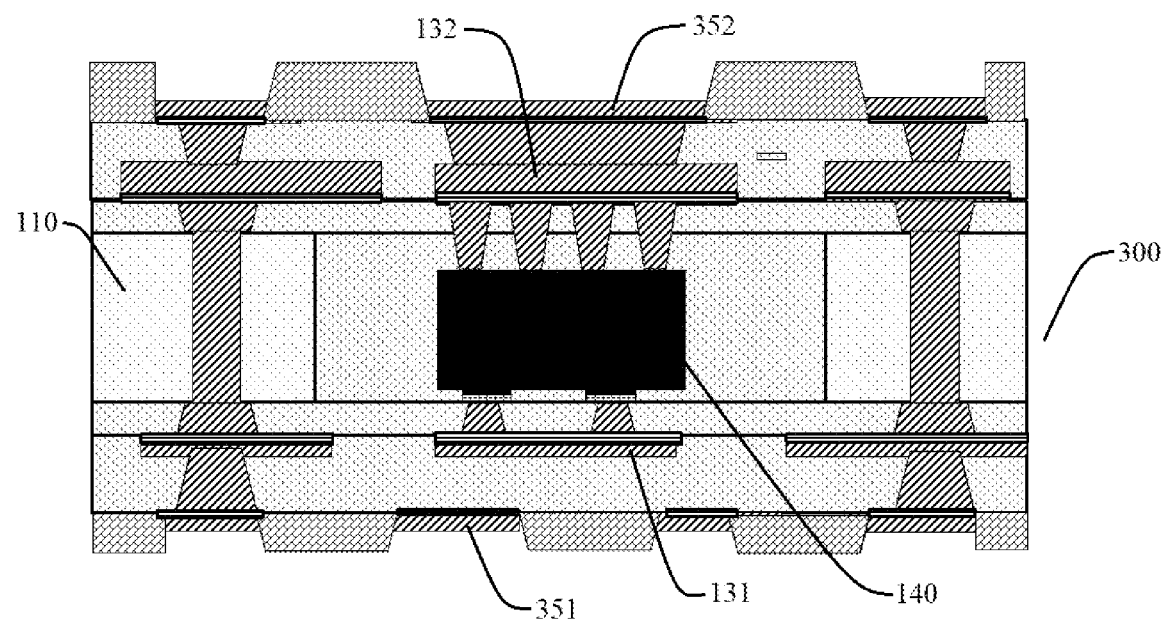
FIG. 3 is a schematic side view of a third embedded chip structure.

FIG. 3 shows that on both sides of the chip package 100 of FIG. 1, additional wiring layers 351, 352 are further formed to build up a multi-layer interconnection structure 300. Also, on the chip package 200 of FIG. 2, it is possible to further build up an additional layer to form package-on-package (PoP) as well as a similar interconnection structure.

It is to be understood that the layer building up processing may be performed simultaneously on both sides of the frame. It is also to be understood that as the seed layers may be sputtered on both sides of the frame and the chip, additional wiring layers and conduction structures may be constructed on both sides. Once the wiring layer having a conductor feature structure is formed on the packaged one side or both sides, it is possible to attach another chip onto the conductor feature structure by means of technologies of Ball Grid Array (BGA) or Land Grid Array (LGA), etc.

It is to be understood that the packaging technologies described herein may be used to package chips having circuits on both sides. Thus, the wafer can be processed on both sides, for example, with a processor chip on one side and a memory chip on the other side.

It is to be understood that the packaging technologies described herein are not limited to IC chip packaging. In some embodiments, the chips comprise passive devices selected from fuse, capacitor, inductor and filter.

Referring to FIGS. 4A to 4I, a method for manufacturing the embedded chip package structure of FIG. 1 is shown. However, it is to be understood that the method may be applicable to manufacture other similar structures, such as those shown in FIGS. 2 and 3.

The method comprises the step of obtaining a chip socket array comprising a first polymer frame 110 (referring to FIG. 4A), wherein each through socket 130 is defined by the frame 110, and optionally at least one frame via-post 120 passing through the frame 110 is included. It is possible to make an organic frame 110 according to the US patent publication US20160165731A1 wherein the frame 110 has upper and lower surfaces 112, 111 and a cavity or socket 130 in an array arrangement generated based on the chip size. The frame 110 has a thickness which is larger than and is close to the chip thickness, generally larger than the chip thickness by 15~50 μm.

The frame 110 is placed on an adhesive tape 150. The chip 140, facing downwards (i.e. its terminal face facing downwards), is placed into a cavity 130 of the frame 110 such that the chip terminal face 141 is in contact with the adhesive tape 150 (referring to FIG. 4B). The adhesive tape 150 is generally a commercially available transparent film which can be decomposed by heating or exposure to UV light. It is possible to perform imaging through the adhesive tape to achieve alignment or exposure, thus facilitating curing of the photosensitive polymer dielectric.

Figure 4A:
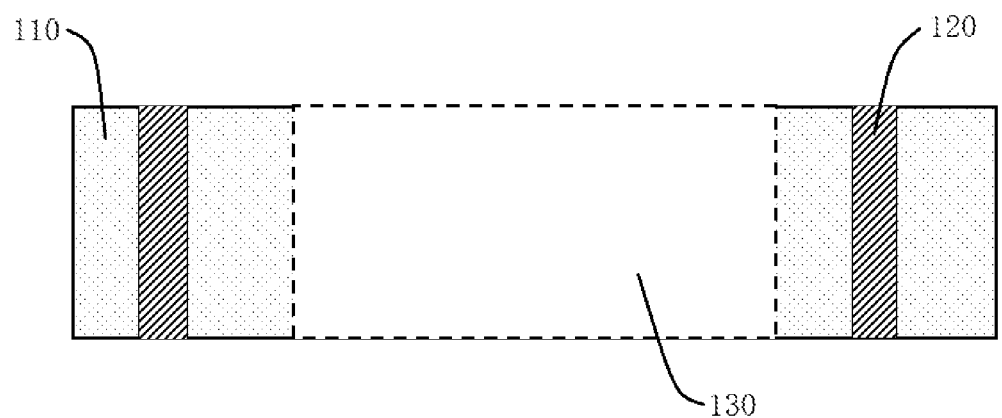
FIGS. 4A to 4I schematically show intermediate structures obtained by steps of the method of the present invention.
Figure 4B:
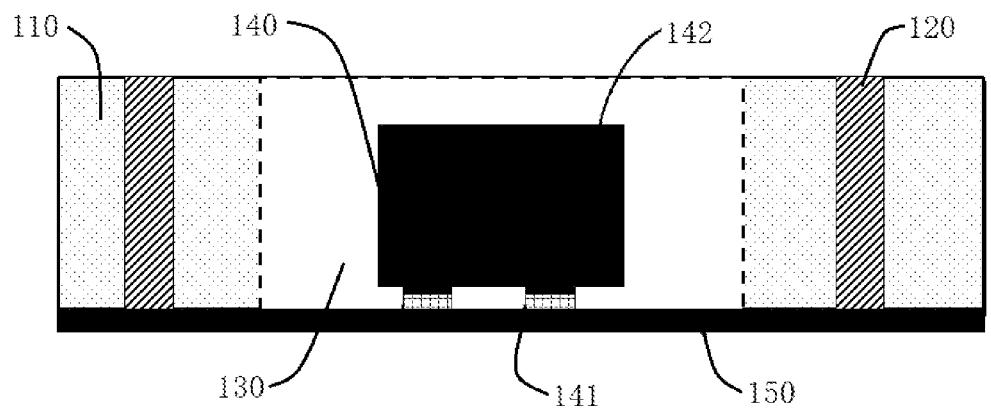
Figure 4C:
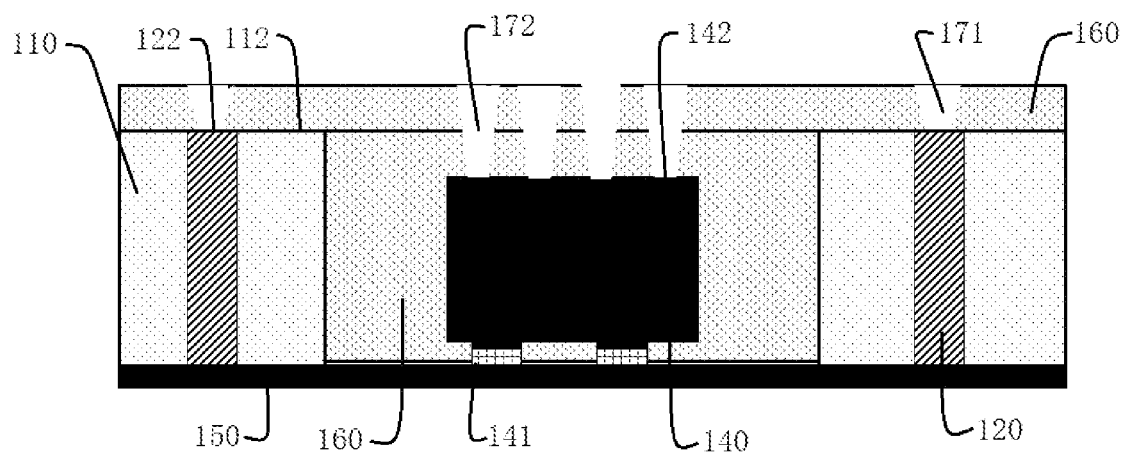
Figure 4D:
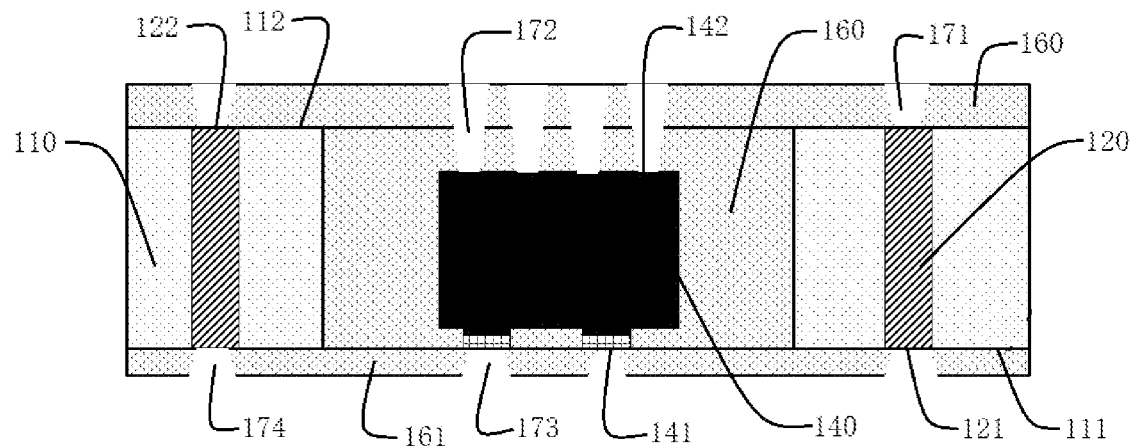

On the frame 110 comprising the chip 140, a photosensitive polymer dielectric 160 (such as a polyimide photosensitive resin or a polyphenylene oxide photosensitive resin) serving as the packaging material is laminated or coated such that the photosensitive polymer dielectric 160 fully fills the gap between the chip 140 and the frame 110 and covers the back face 142 of the chip, an upper surface 112 of the frame and an upper surface 122 of the Cu post 120 (referring to FIG. 4C).

The photosensitive polymer dielectric 160 on the side of the chip back face is exposed by an exposure machine and is developed to form a first pattern. The photosensitive polymer dielectric in hole positions in the first pattern is not cured and thus is removed. Therefore, the first pattern comprises a first blind via 171 exposing the upper surface 122 of the frame via-post 120 on the frame 110 and a second blind via 172 exposing the back face 142 of the chip 140 (referring to FIG. 4C).

It is also possible to perform auxiliary exposure on the side of the adhesive tape to facilitate rapid curing of the photosensitive polymer dielectric filled between the frame and the chip.

Then, the adhesive tape 150 is removed, and the photosensitive polymer dielectric 161 is laminated or coated onto the terminal face 141 of the chip 140 and the lower surface 111 of the frame. The photosensitive polymer dielectric 161 is exposed and developed to form a second pattern. The second pattern comprises a third blind via 173 exposing a metal terminal pad on the terminal face 141 of the chip 140 and a fourth blind via 174 exposing a lower end face 121 of the frame via-post 120 on the frame lower surface 111 (referring to FIG. 4D).

According to the specific adhesive tape as used, the adhesive tape 150 may be burned out or removed by exposure to UV light. The photosensitive polymer dielectrics 160 and 161 may be the same or different photosensitive polymer dielectrics, and may be different only in thickness.

Figure 4E:
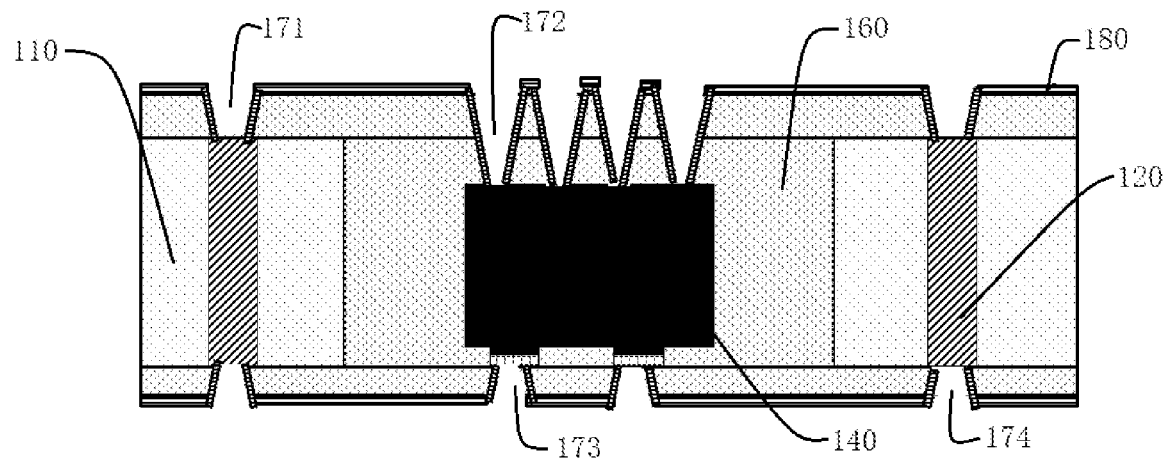
Figure 4F:
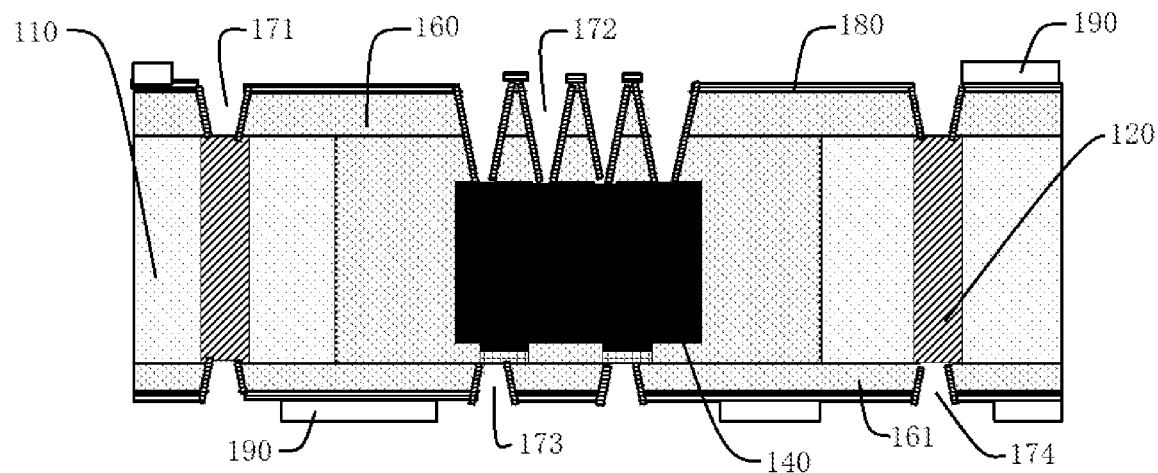

A chemical plating or sputtering method is used to form metal seed layers 180 on the surfaces of the photosensitive polymer dielectrics 160, 161 and in the blind vias 171, 172, 173, 174 (referring to FIG. 4E). The metal commonly used for the seed layer is selected from Ti, Cu, or Ti-Wu alloys, but is not limited to the above metals.

Photoresist layers 190 are applied onto the metal seed layers 180 on both sides of the package 100, and a third pattern comprising a first wiring layer and a second wiring layer is formed directly by means of exposure and development. The third pattern of the photoresist layer 190 formed by exposure and development exposes the metal seed layers 180 in positions where it is necessary to form the first and second wiring layers (referring to FIG. 4F).

Figure 4G:
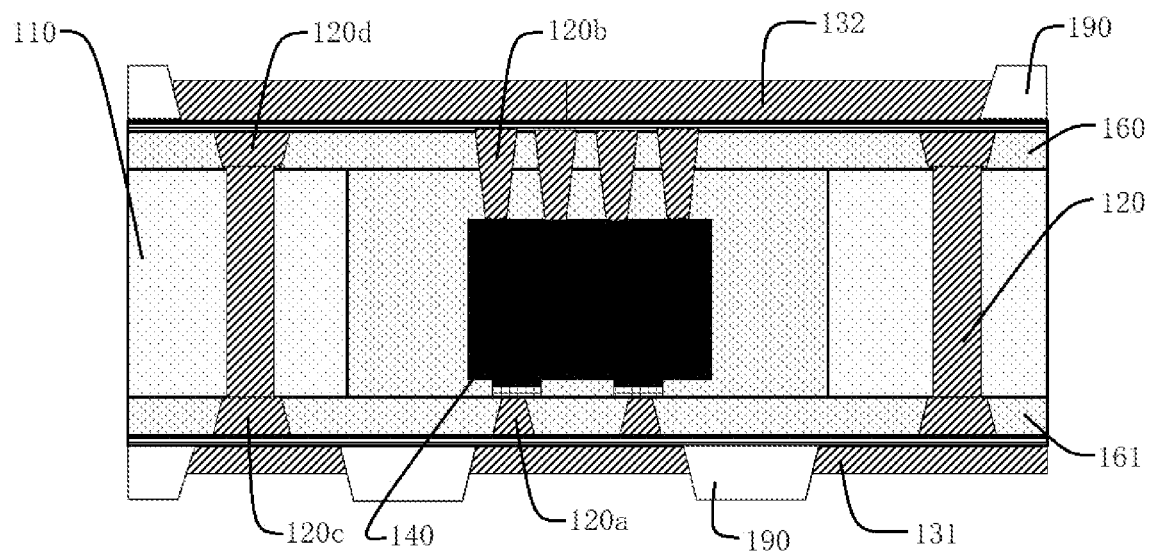

An electroplating method is used to plate and fill Cu into the first, second and third patterns such that all the opened blind vias and openings on the wiring layers are filled with Cu simultaneously to form first, second, third and fourth via-posts 120a, 120b, 120c, 120d as well as the first and second wiring layers 131, 132 (referring to FIG. 4G).

Figure 4H:
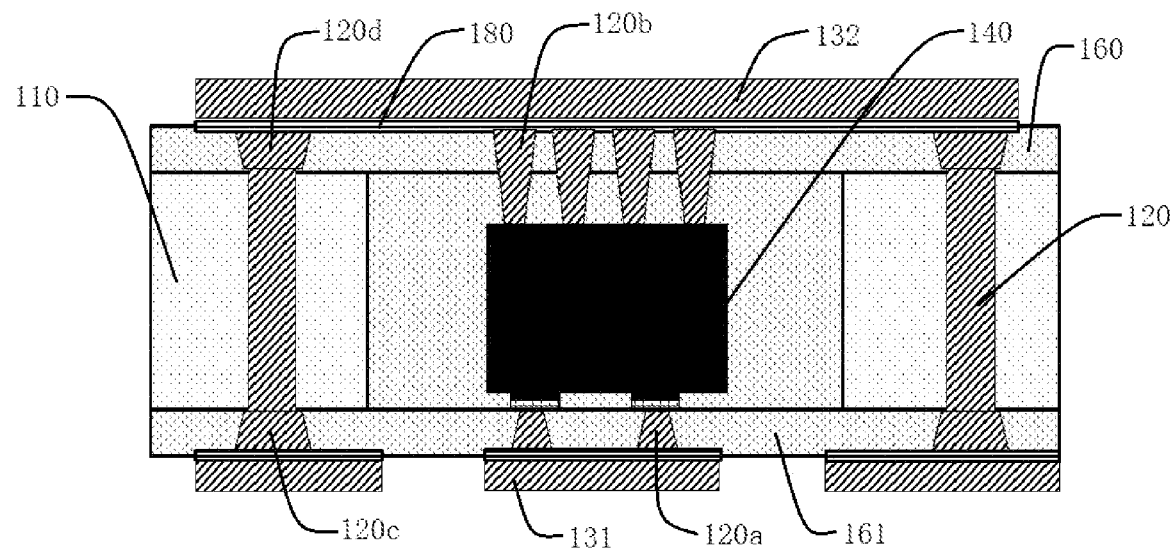
Figure 4I:
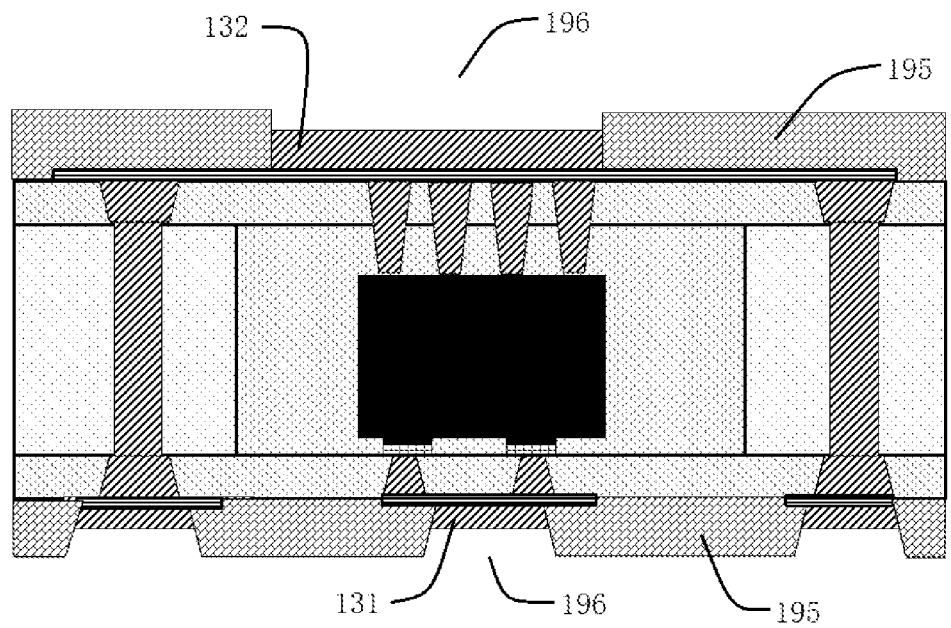

A dry-film remover agent is used to remove the photoresist layer 190, and then an etching method is used to remove the exposed metal seed layers 180 (referring to FIG. 4H).

According to the specific requirement(s), the layer building up and re-wiring processes can be performed for several times on the upper and lower surfaces of the substrate, without any surface treatment, to stack and construct an additional wiring layer. The dielectric for the layer building up may be the photosensitive polymer dielectric or the traditional packaging material, such as a thermosetting dielectric or a thermoplastic dielectric. The method for the layer building up to form an additional wiring layer may be a common method, such as dry etching, etc.

The finished embedded chip package may be applied with a solder mask 195 on one side or both sides of the outer layer by coating or laminating. The solder resist comprises AUS308 or AUS410, etc., but is not limited to the above materials. On the solder mask 195, a specific solder mask window 196 may be formed by photoresist exposure and development (referring to FIG. 4I).

Finally, the panel array can be cut and divided into individual chip packages. The dividing or cutting may be achieved by using a rotating saw blade or other cutting technologies, such as using a laser.

It will be appreciated by those skilled in the art that the present invention is not limited to the contents as specifically illustrated and described above. Moreover, the scope of the present invention is defined by the appended claims, comprising combinations and sub-combinations of the various technical features as described above as well as the variations and modifications thereof, which can be anticipated by those skilled in the art by reading the above description.

What is claimed is:

1. A method for manufacturing an embedded chip package, the method comprising:

obtaining a chip socket array comprising a frame, wherein the frame is formed therein with a frame via-post passing through a height of the frame;

placing the chip socket array onto an adhesive tape;

placing a chip, with a terminal face of the chip facing downwards, into a cavity of the chip socket array surrounded by the frame;

laminating or coating a first photosensitive polymer dielectric onto the chip and the frame such that the first photosensitive polymer dielectric fully fills a gap between the chip and the frame and covers a back face of the chip and an upper surface of the frame;

exposing and developing the first photosensitive polymer dielectric to form a first pattern which forms a first blind via exposing an end of the frame via-post at the upper surface of the frame and a second blind via revealing the back face of the chip;

removing the adhesive tape, and laminating or coating a second photosensitive polymer dielectric onto the terminal face of the chip and a lower surface of the frame;

exposing and developing the second photosensitive polymer dielectric to form a second pattern which forms a third blind via exposing a terminal of the chip and a fourth blind via exposing an end of the frame via-post at the lower surface of the frame;

applying a metal seed layer onto the first pattern and the second pattern;

applying a photoresist layer onto the metal seed layer, and patterning the photoresist layer to form a third pattern comprising a first wiring layer and a second wiring layer; and performing Cu electroplating to simultaneously fill the first, second and third patterns to form first, second, third and fourth via-posts and the first and second wiring layers.

2. The method according to claim 1, wherein the first photosensitive polymer dielectric and the second photosensitive polymer dielectric are selected from polyimide photosensitive resin or polyphenylene oxide photosensitive resin.

3. The method according to claim 1, wherein the metal seed layer comprises Ti, W, or Ti/W alloys.

4. The method according to claim 1, wherein the first wiring layer is conductively connected through the first via-post to a terminal pad of the chip, the second wiring layer is conductively connected through the second via-post to the back face of the chip.

5. The method according to claim 1, wherein the frame via-post, the first via-post, the second via-post, the third via-post and the fourth via-post comprises Cu.

6. The method according to claim 1, further comprising:
after the Cu electroplating, removing the photoresist layer and etching off the metal seed layer.

7. The method according to claim 6, further comprising:
performing layer building-up and re-wiring on the first and/or second wiring layers to stack and construct an additional wiring layer.

8. The method according to claim 1, further comprising:
applying a solder mask onto the first wiring layer and/or the second wiring layer.

9. The method according to claim 1, further comprising:
cutting the chip socket array into individual package chips.

* * * * *